(12) United States Patent
Romano et al.

(10) Patent No.: US 7,560,366 B1
(45) Date of Patent: Jul. 14, 2009

(54) NANOWIRE HORIZONTAL GROWTH AND SUBSTRATE REMOVAL

(75) Inventors: Linda T. Romano, Sunnyvale, CA (US); Shahriar Mostarshed, San Mateo, CA (US)

(73) Assignee: Nanosys, Inc., Palo Alto, CA (US)

( * ) Notice: Subject to any disclaimer, the term of this patent is extended or adjusted under 35 U.S.C. 154(b) by 404 days.

(21) Appl. No.: 11/291,484

(22) Filed: Dec. 1, 2005

Related U.S. Application Data

(60) Provisional application No. 60/632,337, filed on Dec. 2, 2004.

(51) Int. Cl.
*H01L 21/20* (2006.01)
*H01L 21/36* (2006.01)

(52) U.S. Cl. .................. 438/503; 438/584; 438/759; 438/798; 257/E51.038; 257/E51.04; 977/742; 977/743; 977/762

(58) Field of Classification Search ............. 438/20, 438/99, 278, 503, 514, 584, 689, 759, 798, 438/800; 257/E51.038, E51.04; 977/742, 977/743, 762, 813, 814, 815, 822, 842, 843, 977/844, 888, 890, 891, 892
See application file for complete search history.

(56) References Cited

U.S. PATENT DOCUMENTS

| | | | |
|---|---|---|---|
| 5,920,078 | A | 7/1999 | Frey |
| 5,962,863 | A | 10/1999 | Russell et al. |
| 6,256,767 | B1 | 7/2001 | Kuekes et al. |
| 6,274,007 | B1 | 8/2001 | Smirnov et al. |
| 6,438,025 | B1 | 8/2002 | Skarupo |
| 6,447,663 | B1 | 9/2002 | Lee et al. |
| 6,465,813 | B2 | 10/2002 | Ihm |
| 6,566,704 | B2 | 5/2003 | Choi et al. |
| 6,586,785 | B2 | 7/2003 | Flagan et al. |
| 6,672,925 | B2 | 1/2004 | Talin et al. |
| 6,706,566 | B2 | 3/2004 | Avouris et al. |

(Continued)

FOREIGN PATENT DOCUMENTS

WO     WO-0103208     1/2001

(Continued)

OTHER PUBLICATIONS

Chung, S-W et al., "Silicon nanowire devices" Am. Inst. Phys. (2000) 76(15):2068-2070.

(Continued)

*Primary Examiner*—George Fourson
*Assistant Examiner*—John M Parker
(74) *Attorney, Agent, or Firm*—Andrew L. Filler

(57) ABSTRACT

The present invention provides processes for producing horizontal nanowires that are separate and oriented and allow for processing directly on a substrate material. The nanowires grow horizontally by suppressing vertical growth from a nucleating particle, such as a metal film. The present invention also provides for horizontal nanowire growth from nucleating particles on the edges of nanometer-sized steps. Following processing, the nanowires can be removed from the substrate and transferred to other substrates. The present invention also provides for nanowires produced by these processes and electronic devices comprising these nanowires. The present invention also provides for nanowire growth apparatus that provide horizontal nanowires, and processes for producing nanowire devices.

23 Claims, 7 Drawing Sheets

U.S. PATENT DOCUMENTS

| | | | |
|---|---|---|---|
| 6,760,245 | B2 | 7/2004 | Eaton et al. |
| 6,790,425 | B1 | 9/2004 | Smalley et al. |
| 6,798,000 | B2 | 9/2004 | Luyken et al. |
| 6,815,218 | B1 | 11/2004 | Jacobson et al. |
| 6,872,645 | B2 | 3/2005 | Duan et al. |
| 6,903,717 | B2 | 6/2005 | Takahashi et al. |
| 7,208,094 | B2* | 4/2007 | Islam et al. ............... 216/2 |
| 2002/0014667 | A1* | 2/2002 | Shin et al. ............... 257/368 |
| 2002/0117659 | A1 | 8/2002 | Lieber et al. |
| 2002/0127495 | A1 | 9/2002 | Scherer |
| 2002/0130311 | A1 | 9/2002 | Lieber et al. |
| 2002/0130353 | A1 | 9/2002 | Lieber et al. |
| 2002/0163079 | A1 | 11/2002 | Awano |
| 2002/0173083 | A1 | 11/2002 | Avouris et al. |
| 2002/0175408 | A1 | 11/2002 | Majumdar et al. |
| 2003/0012723 | A1 | 1/2003 | Clarke |
| 2003/0042562 | A1 | 3/2003 | Giebeler et al. |
| 2003/0089899 | A1 | 5/2003 | Lieber et al. |
| 2003/0186522 | A1 | 10/2003 | Duan et al. |
| 2003/0189202 | A1 | 10/2003 | Li et al. |
| 2004/0005258 | A1 | 1/2004 | Fonash et al. |
| 2004/0031975 | A1 | 2/2004 | Kern et al. |
| 2004/0036126 | A1 | 2/2004 | Chau et al. |
| 2004/0036128 | A1* | 2/2004 | Zhang et al. ............... 257/401 |
| 2004/0061422 | A1 | 4/2004 | Avouris et al. |
| 2004/0112964 | A1* | 6/2004 | Empedocles et al. ........ 235/491 |
| 2004/0213307 | A1 | 10/2004 | Lieber et al. |
| 2004/0238887 | A1 | 12/2004 | Nihey |
| 2005/0064185 | A1 | 3/2005 | Buretea et al. |
| 2005/0064618 | A1 | 3/2005 | Brown et al. |
| 2005/0079659 | A1 | 4/2005 | Duan et al. |
| 2006/0019472 | A1 | 1/2006 | Pan et al. |
| 2007/0228583 | A1* | 10/2007 | Islam et al. ............... 257/784 |
| 2008/0072818 | A1* | 3/2008 | Mostarshed et al. ........... 117/87 |

FOREIGN PATENT DOCUMENTS

| | | |
|---|---|---|
| WO | WO-0217362 | 2/2002 |
| WO | WO-0248701 | 6/2002 |

OTHER PUBLICATIONS

Cui, Y., et al., "Nanowire nanosensors for highly sensitive and selective detection of biological and chemical species," Science (2001) 293:1289-1292.

Duan, X. et al., "General synthesis of compound semiconductor nanowires" Adv. Mater. (2000) 12:298-302.

Duan, X., et al. "Nanowire Nanoelectronics Assembled from the Bottom-up," in Molecular Nanoelectronics, Reed, M. ed., American Scientific Publisher, New York (2002) 199-227.

Duan, X., et al., "Nonvolatile memory and programmable logic from molecule-gated nanowires" Nano Letters (2002) 2:487-490 (2002).

Duan, X. et al., "High performance thin-film transistors using semiconductor nanowires and nanoribbons" Nature (2003) 425:274-278.

Gudiksen, M.S., et al., "Synthetic control of the diameter and length of single crystal semiconductor nanowires", J. Phys. Chem. B (2001) 105:4062-4064.

Huang, Y. et al., "Logic gates and computation from assembled nanowire building blocks" Science (2001) 294:1313-1317.

Huang, Y. et al., "Gallium nitride nanowire nanodevices" Nano Letters (2002) 2:101-104.

Islam, M.S. et al., "Ultrahigh-densigy silicon nanobridges formed between two vertical silicon surfaces" Nanotechnology (2004) 15:L5-L8.

Swihart, M.T. et al., "On the mechanism of homogeneous decomposition of the chlorinated silanes. Chain reactions propagated bye divalent silicon species" J. Phys Chem A (1998) 102:1542-1549.

Tans, S.J. et al., "Room-temperature transistor based on a single carbon nanotube" Nature (1998) 393:49-52.

Wang, J., et al., "Highly polarized photoluminescence and photodetection from single indium phosphide nanowires" Science 293:1455-1457 (2001).

Yamada, T. "Analysis of submicron carbon nanotube field-effect transistors" Appl. Phys. Letts (2000) 76(5):628-630.

* cited by examiner

NANOWIRE HORIZONTAL GROWTH AND SUBSTRATE REMOVAL

CROSS-REFERENCE TO RELATED APPLICATIONS

This application claims priority to U.S. Provisional Patent Application No. 60/632,337, filed Dec. 2, 2004, which is incorporated herein in its entirety.

BACKGROUND OF THE INVENTION

1. Field of the Invention

The present invention relates to processes for preparing, harvesting and processing nanowires, and to nanowires and devices produced by those processes.

2. Background Art

An interest exists in industry in developing low cost electronics, and in particular, in developing low cost, large area electronic devices. Availability of such large area electronic devices could revolutionize a variety of technology areas, ranging from civil to military applications. Example applications for such devices include driving circuitry for active matrix liquid crystal displays (LCDs) and other types of matrix displays, smart libraries, credit cards, radio-frequency identification tags for smart price and inventory tags, security screening/surveillance or highway traffic monitoring systems, large area sensor arrays, and the like.

Current approaches involve using amorphous silicon or organic semiconductors as the base materials for electronic devices, such as thin-film transistors (TFTs). However, amorphous silicon and organic semiconductors have performance limitations. For example, they exhibit low carrier mobility, typically about 1 $cm^2/V \cdot s$ (centimeter squared per volt second) or less. Furthermore, they require relatively expensive processing, such as laser induced annealing, to improve their performance.

An alternative approach involves using semiconductor nanowires as the building blocks for large area electronic and optoelectronic devices. A wide range of Group IV, III-V and II-VI semiconductor nanowires can be rationally synthesized with tunable chemical composition, physical dimension and electronic properties, as discussed by Duan, X., et al. "Nanowire Nanoelectronics Assembled from the Bottom-up," in Molecular Nanoelectronics, Reed, M. ed., American Scientific Publisher, New York (2002); Duan, X. and Lieber, C. M., *Adv. Mater.* 12:298-302 (2000) and Gudiksen, M. S., et al., *J. Phys. Chem. B* 105:4062-4062 (2001), each of which are incorporated herein, in their entirety, for all purposes.

An extended longitudinal dimension and reduced lateral dimension makes nanowires the smallest dimension materials for efficient transport of electrical carriers. A variety of nanodevices have been demonstrated using the nanowires, including field effect transistors (FETs), logic circuits, memory arrays, light-emitting diodes (LEDs) and sensors, as discussed by Huang, Y. et al., *Nano Letters* 2:101-104 (2002); Huang, Y. et al., *Science* 294:1313-1317 (2001); Duan, X., et al., *Nano Letters* 2:487-490 (2002); Wang, J., et al., *Science* 293:1455-1457 (2001); Cui, Y., et al., *Science* 293:1289-1292 (2001); and commonly owned co-pending U.S. patent application Ser. No. 10/674,060, filed Sep. 20, 2003, each of which are incorporated herein, in their entirety, for all purposes.

At present, growth and placement of nanowires for creating devices is a difficult integration problem. There exists a need for processes by which substantially straight, oriented nanowires can be grown in a device configuration, thereby eliminating the need to transfer nanowires to a secondary substrate. In addition, there is a need for processes incorporating nanowire structures on plastic substrates, as both growth and device processing occur at temperatures greater than most plastics can tolerate.

BRIEF SUMMARY OF THE INVENTION

The present invention overcomes the before-mentioned drawbacks by providing processes for preparing horizontally grown nanowires that can then be easily transferred, processed and/or harvested.

In one embodiment, the present invention provides processes for producing nanowires, comprising: (a) providing a base substrate; (b) forming one or more nucleating particle on the base substrate; (c) forming a nanowire growth-inhibiting layer on the nucleating particle; and (d) contacting the one or more nucleating particle with one or more precursor gas mixtures, whereby nanowires are grown from a side surface of the nucleating particle(s). The processes of the present invention can also comprise forming a removable layer on the base substrate prior to forming the nucleating particle(s) in step (b), and can further comprise forming a separation layer on the removable layer prior to forming the nucleating particle(s) in step (b). In other embodiments, the processes of the present invention can comprise forming a separation layer on the base substrate prior to forming of the nucleating particle(s) in step (b).

In various embodiments, the nucleating particles useful in the practice of the present invention are metallic films, suitably Au, Pt, Fe, Ti, Ga, Ni or Sn films, which have been formed (e.g., etched) into a plurality of contact pads on the surface of the substrate. In suitable embodiments, the separation layer can be an oxide layer, the nanowire growth-inhibiting layer can be silicon oxide, and the base substrate can comprise silicon, for example.

In the practice of the present invention, the precursor gas mixtures utilized in step (d) will suitably comprise $SiH_4$, $Si_2H_6$, $SiCl_4$ or $SiH_2Cl_2$, and further comprise $B_2H_6$, $POCl_3$ or $PH_3$.

In other embodiments, the processes of the present invention can further comprise steps such as (e) depositing a dielectric layer or metallic layer on the surface of the nanowires, (f) depositing a first flexible substrate material, which can comprise metal contacts, on the nanowires, (g) removing the removable layer, and (h) depositing a second flexible substrate material on the nanowires.

In other embodiments, the present invention provides processes for producing nanowires, comprising: (a) providing a base substrate; (b) forming a separation layer on the base substrate; (c) forming one or more nucleating particle on an edge of the separation layer; and (d) contacting the nucleating particle(s) with one or more precursor gas mixtures, whereby nanowires are grown from the nucleating particle(s) substantially normal to the edge of the separation layer. In such embodiments, the separation layer is about 10 nm to about 500 nm in thickness. Such processes of the present invention can also further comprise forming a removable layer on the base substrate prior to forming the separation layer. In certain embodiments, the nucleating particle is a metallic colloid, suitably a Au, Pt, Fe, Ti, Ga, Ni or Sn colloid. In suitable such embodiments, the nanowires will be grown substantially parallel to the base substrate and in a single layer.

The present invention also provides nanowires produced by any the processes of the present invention and electronic circuits comprising these nanowires.

In another embodiment, the present invention provides apparatus for producing substantially horizontal nanowires, comprising: a base substrate; one or more nucleating particles formed on the base substrate; and a nanowire growth-inhibiting layer formed on the one or more nucleating particles. The apparatus of the present invention can further comprise a removable layer formed on the base substrate beneath the one or more nucleating particles, or can further comprise a separation layer formed on the base substrate beneath the one or more nucleating particles. In other embodiments, where a removable layer is used, the apparatus of the present invention further comprise a separation layer formed on the removable layer, beneath the one or more nucleating particles.

The present invention also provides processes for producing nanowire devices, comprising: (a) providing a base substrate; (b) forming a removable layer on the base substrate; (c) forming a separation layer on the removable layer; (d) forming one or more nucleating particle on the separation layer; (e) forming a nanowire growth-inhibiting layer on the nucleating particle(s); (f) contacting the nucleating particle(s) with one or more precursor gas mixtures, whereby nanowires are grown from a side surface of the nucleating particle(s); (g) depositing a dielectric layer or metallic layer on the nanowires; and (h) generating electronic contacts on the separation layer. In other embodiments, the processes for producing nanowire devices can further comprise steps such as (i) depositing a first flexible substrate on the nanowires; (g) removing the removable layer; and (k) depositing a second flexible substrate on the nanowires to enclose the device.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 1a-b are flow charts depicting processes for preparing nanowires, in accordance with certain embodiments of the present invention.

The present invention will now be described with reference to the accompanying drawings. In the drawings, like reference numbers indicate identical or functionally similar elements.

DETAILED DESCRIPTION OF THE INVENTION

Figure 1A:
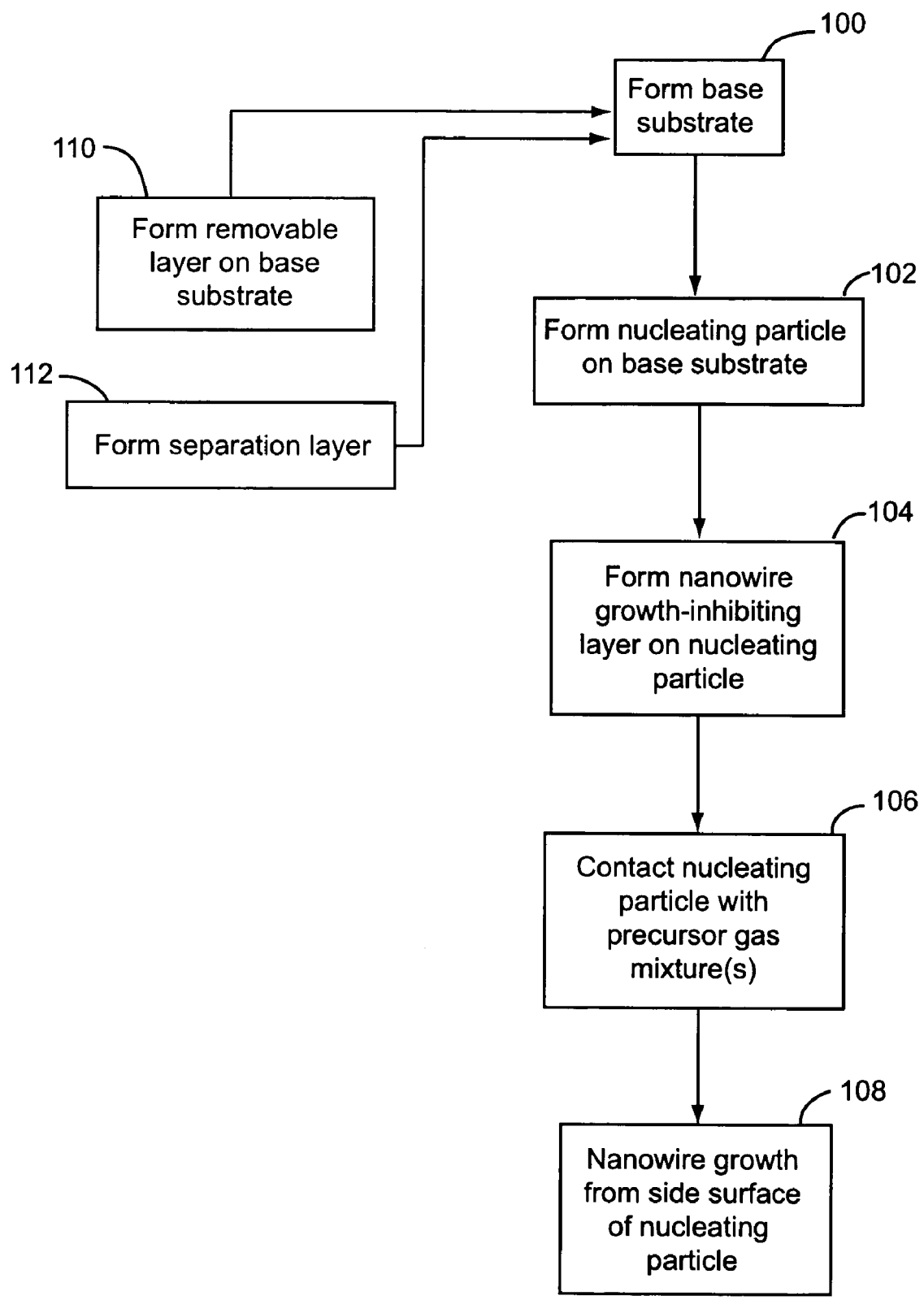

The growth of wires from the side walls of a trench (horizontally) is similar to wire growth on a surface (vertically) as both rely on growth out of the surface of a film (thickness defines drop size and hence wire diameter) or colloidal particles placed on the side wall of the trench. The processes of the present invention are advantageous because they produce horizontal, substantially separate, oriented, nanowires that do not require the removal of the wires from the growth substrate after growth for post-processing of the wires, and limit the need for unconventional processing techniques during device manufacturing.

It should be appreciated that the particular implementations shown and described herein are examples of the invention and are not intended to otherwise limit the scope of the present invention in any way. Indeed, for the sake of brevity, conventional electronics, manufacturing, semiconductor devices, and nanowire (NW), nanorod, nanotube, and nanoribbon technologies and other functional aspects of the systems (and components of the individual operating components of the systems) may not be described in detail herein. While the number of nanowires and spacing of those nanowires are provided for the specific implementations discussed, the implementations are not intended to be limiting and a wide range of the number of nanowires and spacings can also be used. It should be appreciated that although nanowires are frequently referred to, the techniques described herein are also applicable to nanorods, nanotubes, nanocrystals, nanotetrapods and nanoribbons. It should further be appreciated that the manufacturing techniques described herein could be used to create any semiconductor device type, and other electronic component types. Further, the techniques would be suitable for application in electrical systems, optical systems, consumer electronics, industrial and military electronics, wireless systems, space applications, or any other application.

As used herein, the term "nanowire" generally refers to any elongated conductive or semiconductive material (or other material described herein) that includes at least one cross sectional dimension that is less than about 1 µm. Suitably, a nanowire produced according to the present invention will be less than about 500 nm, less than about 300 nm, less than about 200 nm, and less than about 100 nm in diameter. In suitable embodiments, nanowires of the present invention have an aspect ratio (length:width) of greater than about 10, suitably greater than about 50, and more suitably greater than about 100. As used herein, when referring to any numerical value, "about" means a value of ±10% of the stated value (e.g., "about 100 nm" encompasses a range of sizes from 90 nm to 110 nm, inclusive). Examples of such nanowires include semiconductor nanowires as described in Published International Patent Application Nos. WO 02/17362, WO 02/48701, and WO 01/03208, carbon nanotubes, and other elongated conductive or semiconductive structures of like dimensions.

While suitable nanowire materials include CdS and Si, other types of materials for nanowires and nanoribbons can be used, including semiconductive nanowires or nanoribbons, that are comprised of semiconductor material selected from, e.g., Si, Ge, Sn, Se, Te, B, C (including diamond), P, B—C, B—P(BP6), B—Si, Si—C, Si—Ge, Si—Sn and Ge—Sn, SiC, BN, BP, BAs, AlN, AlP, AlAs, AlSb, GaN, GaP, GaAs, GaSb, InN, InP, InAs, InSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, AgF, AgCl, AgBr, AgI, BeSiN$_2$, CaCN$_2$, ZnGeP$_2$, CdSnAs$_2$, ZnSnSb$_2$, CuGeP$_3$, CuSi$_2$P$_3$, (Cu, Ag) (Al, Ga, In, Tl, Fe) (S, Se, Te)$_2$, Si$_3$N$_4$, Ge$_3$N$_4$, Al$_2$O$_3$, (Al, Ga, In)$_2$ (S, Se, Te)$_3$, Al$_2$CO, and an appropriate combination of two or more such semiconductors.

In certain aspects, the semiconductor may comprise a dopant from a group consisting of: a p-type dopant from Group III of the periodic table; an n-type dopant from Group V of the periodic table; a p-type dopant selected from a group consisting of: B, Al and In; an n-type dopant selected from a group consisting of: P, As and Sb; a p-type dopant from Group II of the periodic table; a p-type dopant selected from a group consisting of: Mg, Zn, Cd and Hg; a p-type dopant from Group IV of the periodic table; a p-type dopant selected from a group consisting of: C and Si; or an n-type dopant selected from a group consisting of: Si, Ge, Sn, S, Se and Te.

Additionally, the nanowires or nanoribbons can include carbon nanotubes, or nanotubes formed of conductive or semiconductive organic polymer materials, (e.g., pentacene, and transition metal oxides).

Hence, although the term "nanowire" is referred to throughout the description herein for illustrative purposes, it is intended that the description herein also encompass the use of nanotubes (e.g., nanowire-like structures having a hollow tube formed axially therethrough). Nanotubes can be formed in combinations/thin films of nanotubes as is described herein for nanowires, alone or in combination with nanowires, to provide the properties and advantages described herein.

Furthermore, it is noted that a thin film of nanowires of the present invention can be a "heterogeneous film," which incorporates semiconductor nanowires and/or nanotubes, and/or nanorods, and/or nanoribbons, and/or any combination thereof of different composition and/or structural characteristics. For example, a "heterogeneous film" can include nanowires/nanotubes with varying diameters and lengths, and nanotubes and/or nanotubes that are "heterostructures" having varying characteristics.

In the context of the invention, although the focus of the detailed description relates to harvesting, attachment, association or transfer of nanowires, nanorods, nanotubes, or nanoribbon thin films to plastic substrates, the substrate to which these nano structures are attached may comprise other materials, including, but not limited to: a uniform substrate, e.g., a wafer of solid material, such as silicon, glass, quartz, polymerics, etc.; a large rigid sheet of solid materials, e.g., glass, quartz, plastics such as polycarbonate, polystyrene, etc.; or can comprise additional elements, e.g., structural, compositional, etc. In certain embodiments, the growth substrate and the harvesting substrate can be one and the same, i.e., nanowire growth can take place on the same substrate on which further device processing takes places. A flexible substrate, such as a roll of plastic such as polyolefins, polyamide, and others, a transparent substrate, or combinations of these features can be employed. For example, the substrate may include other circuit or structural elements that are part of the ultimately desired device. Particular examples of such elements include electrical circuit elements such as electrical contacts, other wires or conductive paths, including nanowires or other nanoscale conducting elements, optical and/or optoelectrical elements (e.g., lasers, LEDs, etc.), and structural elements (e.g., microcantilevers, pits, wells, posts, etc.).

By substantially "aligned" or "oriented" is meant that the longitudinal axes of a majority of nanowires in a collection or population of nanowires is oriented within 30 degrees of a single direction. Although the majority can be considered to be a number of nanowires greater than 50%, in various embodiments, 60%, 75%, 80%, 90%, or other percentage of nanowires can be considered to be a majority that are so oriented. In certain preferred aspects, the majority of nanowires are oriented within 10 degrees of the desired direction. In additional embodiments, the majority of nanowires may be oriented within other numbers or ranges of degrees of the desired direction.

As used herein, the term "mesa" refers to the structure of a nanowire growth-inhibiting layer formed on a nucleating particle so as to cover some or all of the top surface of the nucleating particle. Two or more nucleating particles having finite thicknesses form "trench" structures, where trenches (i.e., voids or gaps) exist between the nucleating particles along the surface of a substrate or other surface on which the nucleating particles may have been formed. In such a structure, the side surfaces of the nucleating particles form the "walls" of the trenches from which nanowire growth will occur.

As used herein, the term "layer" is used to indicate a deposit, covering, film, or other similar material. Layers as used herein can be any suitable thickness, for example a few atoms thick to 100's of nanometers to millimeters in thickness, depending on the application.

As used herein, the term "forming" is used to indicate that a specific layer, substrate material, nucleating particle, or other material is generated, deposited, coated, applied, layered or otherwise placed in contact with another layer or particle. Forming also encompasses the initial generation of a substrate, layer, particle or other material and in certain instances does not require contact with another layer, particle or material.

It should be understood that the spatial descriptions (e.g., "above," "below," "up," "down," "top," "bottom," etc.) made herein are for purposes of illustration only, and that devices of the present invention can be spatially arranged in any orientation or manner.

Figure 2A:
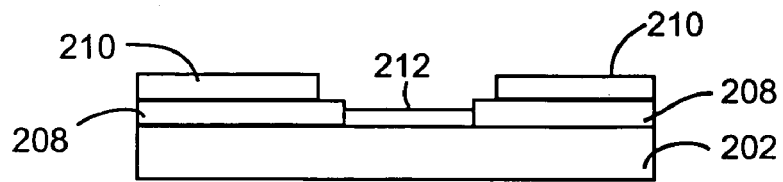
FIGS. 2a-2c are side views of nanowire growth apparatus, in accordance with certain embodiments of the present invention.
Figure 2B:
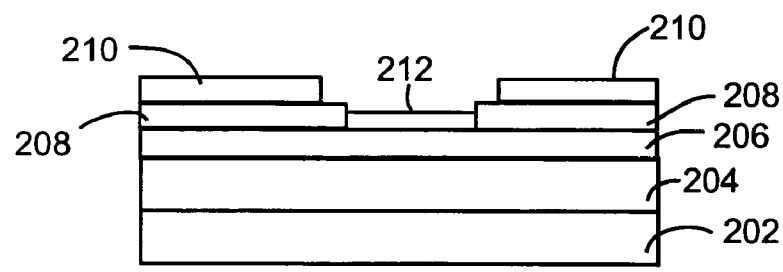

In one embodiment, the present invention provides processes for producing nanowires as outlined in FIG. 1a. Reference is made to the components of nanowire growth apparatus 200 illustrated in FIGS. 2a and 2b, showing two non-limiting example versions of nanowire growth apparatus 200 in accordance with the present invention. In steps 100 and 102 of FIG. 1a, following formation of a base substrate, one or more nucleating particles, 208, are formed on base substrate 202 (FIG. 2a). In an exemplary embodiment, the one or more nucleating particles 208 is formed by depositing a thin film of a catalyst material (e.g., Au) on the base substrate 202, and then patterning the thin film (e.g., by etching) to form a plurality of catalyst pads 208 on the substrate that can then be used to initiate wire growth as described further below.

Base substrate materials for use in the practice of the present invention can be any suitable substrate known to the ordinarily skilled artisan. In certain embodiments, the base substrate material is a crystallographic substrate. The term "crystallographic substrate" includes any substrate material that comprises atoms situated in a repeating or periodic array over large atomic distances, typically on the order of 10 or more angstroms (Å). Such crystallographic substrates may be polycrystalline or may comprise single crystals. Suitably, the crystallographic substrate utilized in the processes of the present invention is silicon (Si). Other suitable crystallographic materials include, but are not limited to, germanium (Ge), gallium arsenide (GaAs), gallium nitride (GaN), sapphire, quartz, and silicon germanium (SiGe).

In other embodiments of the present invention, the base substrate material may comprise an amorphous material. Suitable amorphous substrate materials that can be used in the practice of the present invention include, but are not limited to $SiO_2$, $Si_3N_4$ and alumina. In other embodiments, the base substrate material can comprise both amorphous and crystalline materials in the same substrate.

Nucleating particles that may be used in the practice of the present invention include metal catalysts, metal colloids and metal films, and can be any metal that can react with precursor gas mixtures to form a eutectic phase. Such a phase has a minimum melting point at which all components are in solution. Upon addition of precursor gas molecules (e.g., silicon) a saturation point on the eutectic phase diagram is reached such that semiconductor particles (e.g., Si) begin to precipitate out of the metal solution, thereby creating a growing nanowire. Continuous addition of precursor gas will continue to saturate the eutectic, thereby generating additional material for nanowire growth.

In suitable embodiments, the nucleating particles will be metal films and can comprise any of the transition metals from the Periodic Table, including, but not limited to, copper, silver, gold, nickel, palladium, platinum, cobalt, rhodium, iridium, iron, ruthenium, tin, osmium, manganese, chromium, molybdenum, tungsten, vanadium, niobium, tantalum, titanium, zirconium and gallium, including mixtures of one or more of these metals. In suitable embodiments of the present invention, the metal films are gold (Au) films. In other embodiments, metallic colloids, such as gold particles, can be used. In certain embodiments, the metallic colloids will be on the order of 10's of nanometers in diameter, for example, about 60 nanometer (nm) diameter gold colloids can be used. Other diameter colloids are envisioned. The nucleating particles used to practice the present invention can be formed on the base substrate by heating a gold film layer coating the top surface of the substrate. In other embodiments, the nucleating particles can be formed as metallic colloids using methods known in the art (see e.g., U.S. Provisional Application No. 60/588,363, filed Jul. 16, 2004, and U.S. application Ser. No. 10/674,060, filed Sep. 30, 2003, both of which are incorporated by reference herein in their entireties). Metallic colloids can also be deposited using methods such as polydimethylsiloxane patterning, followed by contact with metallic colloids, as known in the art. Additionally, as described above, the nucleating particles can comprise pads of suitable dimensions formed on the substrate by patterning (e.g., etching) a thin film layer (e.g., a gold film layer) coating the top surface of the substrate.

In step 104 of FIG. 1a, a nanowire growth-inhibiting layer (e.g., 210) is formed on nucleating particles (see 208 of FIGS. 2a and 2b). The nanowire growth-inhibiting layer 210 can be patterned on the surface of the nucleating particle(s) by using conventional photolithographic techniques known to those of ordinary skill in the art. Suitable growth-inhibiting layers can be any such layer known to those skilled in the art that will suppress, either partially or completely, nanowire growth from the nucleating particles. In the case of a metal colloid or pad formed from a thin film, an oxide layer can be used to suppress nanowire growth. For example, when the nucleating particles are gold particles or pads formed from a gold film, the growth inhibiting layer can be a silicon oxide layer or an $Al_2O_3$ layer patterned on the particles using photolithography.

In suitable embodiments of the present invention, nucleating particles 208 are a plurality of pads formed (e.g., etched) from a gold film positioned on base substrate 202 such that the pads are elevated above base substrate 202. As illustrated in FIG. 2a, such a structure provides a horizontally oriented trench across which nanowires 212 can grow between the pads. Covering all or a portion of the top surface of nucleating particles 208 with growth-inhibiting layer 210 generates a "mesa" structure in which all or some of nanowires 212 are forced to grow out of the side wall of nucleating particles 208 in a horizontal orientation, rather than vertically out the top surface of nucleating particles 208. The amount of the top surface of nucleating particles 208 that is covered by growth-inhibiting layer 210 can be adjusted to any percentage of the top surface, e.g., the top surface of nucleating particles 208 can be covered about 10%, to about 100%, and any percentage value in between. By varying the amount of the top surface of nucleating particles 208 (e.g., gold pads) that is covered by growth-inhibiting layer 210, the number and density of nanowires 212 that grow from the side wall surface of the gold pads can be controlled and varied. For example, complete coverage of a patterned gold film with a silicon oxide layer would suppress all vertical growth and force all of the nanowires to grow horizontally from the side surface of the pads. However, allowing some growth from the top surface of the gold pads by only covering a portion of the pads with a silicon oxide layer would reduce the density and number of wires that grow horizontally from the side of the pads.

Any suitable material can be used as growth-inhibiting layer 210. Suitably, this layer should not interfere with or contaminate the growing nanowires. For example, growth-inhibiting layer 210 can be any metal or metal oxide, including titanium oxide, aluminum oxide, silicon oxide, or can be any dielectric material as known in the art.

Figure 2C:
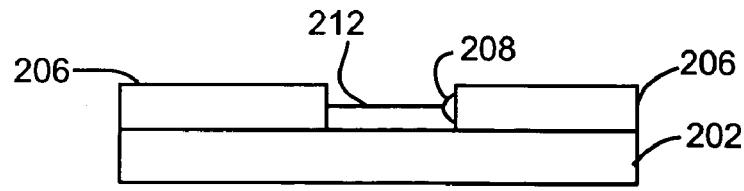

In other embodiments of the present invention, as shown in FIG. 2c, nucleating particles 208, suitably metallic colloids (e.g., which are deposited or formed by heating a thin metallic film deposited on the separation layer or portions thereof), can be formed on the edge of separation layer 206 that has been formed on a base substrate 202. In such embodiments, individual sections of separation layer 206 form "steps" on the order of 100's of nanometers in thickness and extend above the surface of base substrate 202. These steps of separation layer 206 have "edges" or "walls" on which nucleating particles 208, either metallic films, or suitably metallic colloids, can be formed. Any metal described throughout can be used to form the nucleating particles. In suitable embodiments, separation layer 206 creates a step on the order of 10's of nm to 100's of nm in thickness, for example about 10 nm to about 500 nm in thickness. Formation of a nucleating particle 208, suitably a metallic colloid on the order of 10's of nm to 100's of nm in diameter, for example about 10 nm to about 200 nm in diameter, on the edges of the steps separation layer 206 will generate a nucleation point from which nanowires 212 will grow when the nucleating particles are contacted with one or more precursor gas mixtures as described throughout. The diameter of the nanowires which grow from the nucleating particles correlates to the colloid size, which in turn is dependent upon the thickness of the separation layer step. In certain embodiments, a removable layer (as shown in FIG. 2b) can be formed on base substrate 202 prior to formation of the steps of separation layer 206. Example materials for use in forming separation layer 206 are described throughout.

Suitably, the nanowires grown from the nucleating particles in such embodiments will grow substantially normal to the edge of the steps of separation layer 206 and substantially parallel to the base substrate (i.e., in the same plane as the base substrate) and generally will grow in a single layer. As the thickness of the steps of separation layer 206 is on the order of 100's of nanometers, the nanowires will be forced to grow in a lateral direction (with respect to the base substrate) as there is limited depth into which the nanowires can grow before impinging upon the base substrate. As such, the nanowires grown using such processes and apparatus will suitably grow in a single, substantially oriented, horizontal layer above the surface of the base substrate. Growth in such a manner simplifies implementation of additional device processing steps, as described herein, as substantially oriented, single layers of wires are produced. While nanowires 212 are shown in FIG. 2c growing between two steps separation layer 206, it should be understood that where a single step of separation layer is used, nanowires will not impinge on another structure and will continue to grow until the growth conditions are changed or modified so as to stop the growth.

Figure 1B:
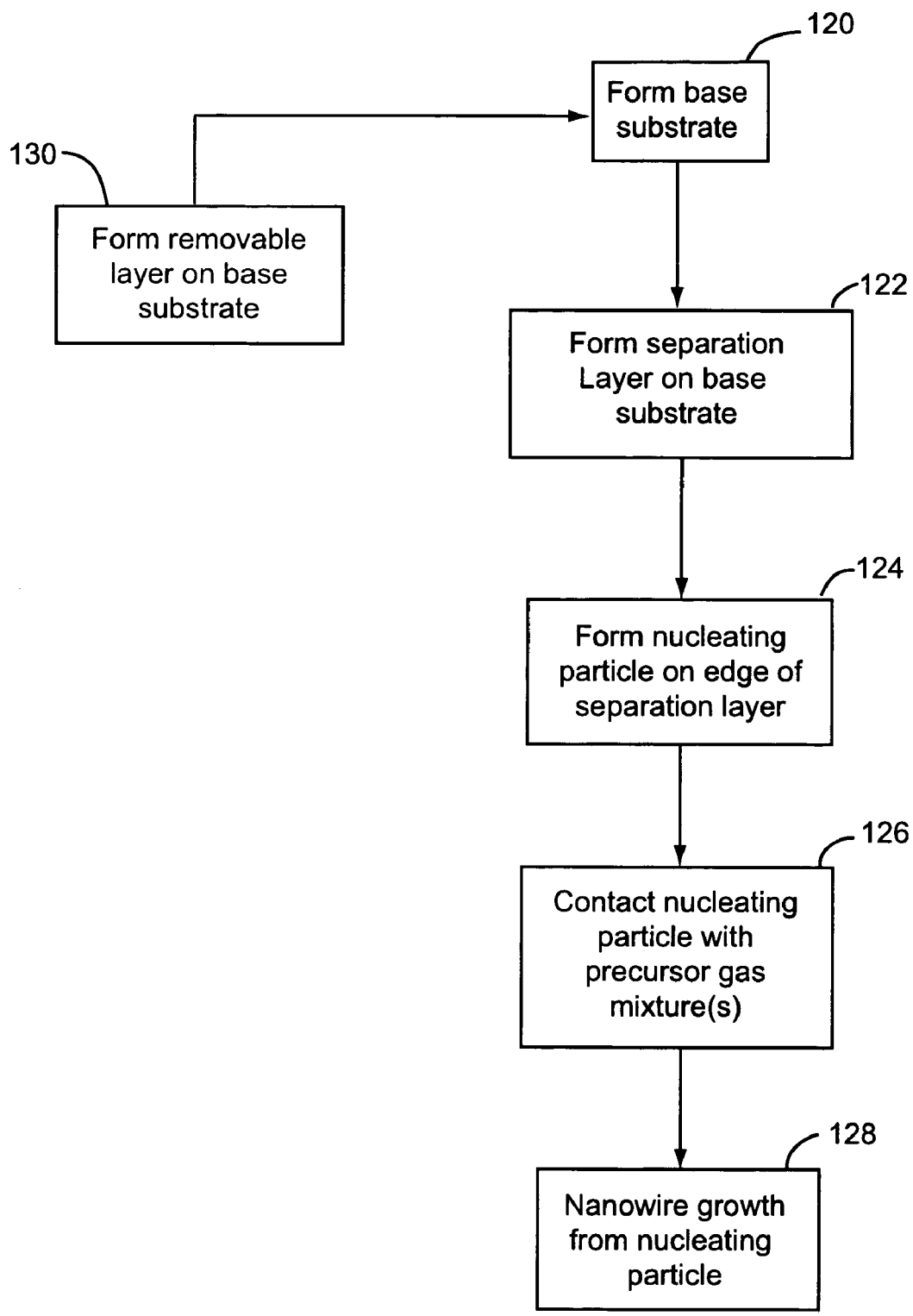

The present invention also provides processes and apparatus for producing nanowires in such a manner. For example, as shown in FIG. 1b, the present invention provides processes for producing nanowires comprising first providing a base substrate as in step 120. A separation layer is then formed on the base substrate in step 122. One or more nucleating particles are then formed on the edge(s) of the separation layer in step 124. The nucleating particles are then contacted with one or more precursor gas mixture(s) in step 126. Finally, in step 128, nanowires are grown from the nucleating particles. In addition, such processes of the present invention can further comprise forming a removable layer on the base substrate in step 130, prior to forming the separation layer in step 122.

Figure 3:
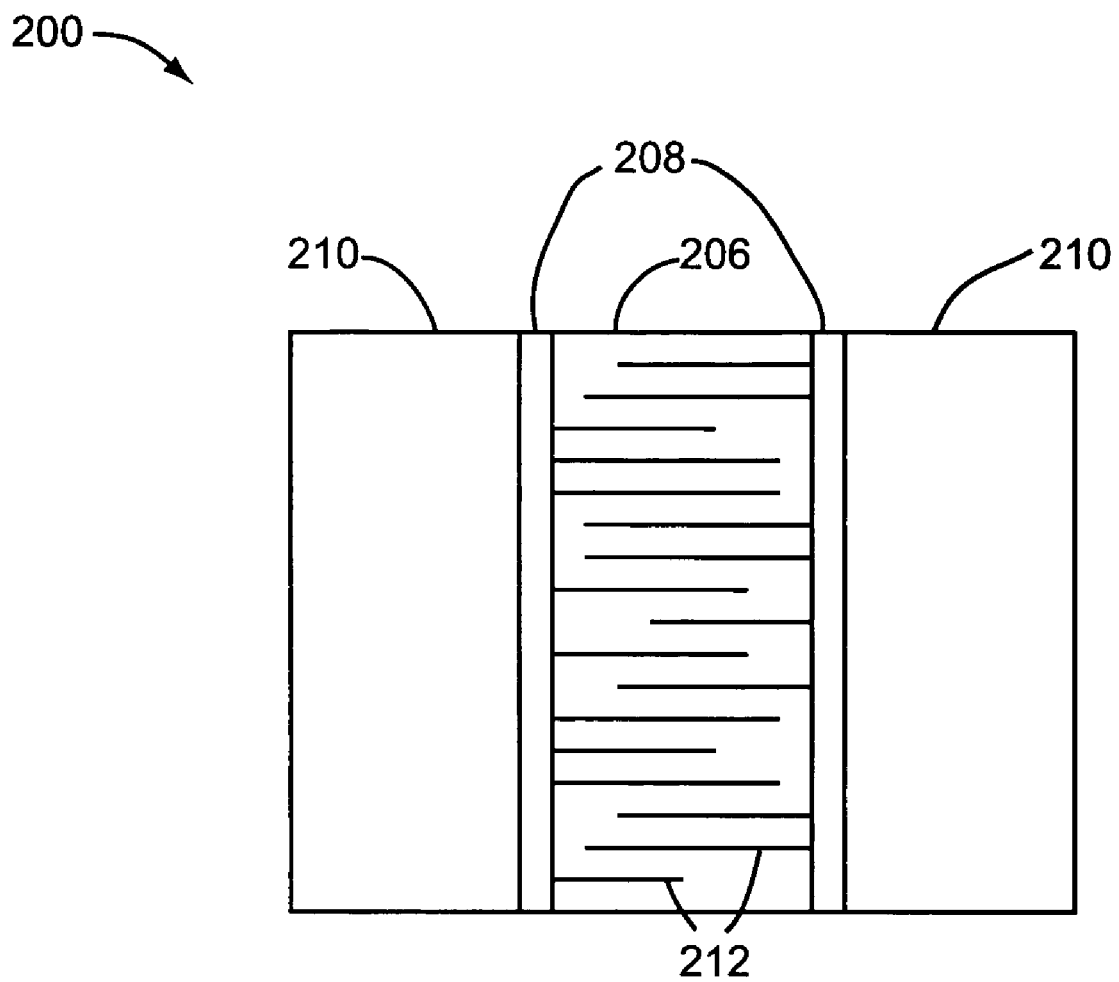
FIG. 3 is a top view of a nanowire growth apparatus, in accordance with one embodiment of the present invention.

FIG. 3 is a top view of nanowire growth apparatus 200, showing horizontally growing nanowires 212 between nucleating particles 208 (e.g., a gold film patterned into a plurality of catalyst pads) covered by growth inhibiting layer 210. Nanowires would also grow vertically out of the uncovered portions of nucleating particles 208, thereby controlling the density of horizontally growing nanowires.

Growth of nanowires from the nucleating particles can be accomplished via any method known to those skilled in the art. Suitably, chemical vapor deposition is used, as in step 106 of FIG. 1a, wherein the nucleating particles are contacted with one or more precursor gas mixtures to initiate and promote nanowire growth from the side surface of the nucleating particles (step 108 in FIG. 1a).

Chemical vapor deposition (CVD) comprises heating a precursor gas mixture to a temperature at which 1) the gas dissociates into its free component atoms, and 2) the nucleating particles (e.g., metal film) melts to a liquid. The free gas molecules can then diffuse into the metal to form a liquid alloy mixture.

In suitable embodiments of the present invention, the precursor gases can comprise a gas which includes at least one atomic species that promotes the growth of nanowires (e.g., Si) as well as an atomic species that aids in orienting the nanowires during their growth (e.g., Cl atoms). For example, the first precursor gas may be selected from, but not limited to, $Si_2H_6$, $SiH_4$, $SiCl_4$ and $SiH_2Cl_2$ gas, preferably $SiCl_4$ or $SiH_2Cl_2$. Heating these Si precursor gases above the temperature at which the thermal energy is sufficient to break the bond energies between the gaseous molecules generates free Si atoms. (e.g., Si—H bond: 93 kcal/mole, Si—Cl bond: 110 kcal/mole, Si—Si bond; 77 kcal/mole, see M. T. Swihart and R. W. Carr, *J. Phys Chem A* 102:1542-1549 (1998).) Provided that this temperature is also high enough to liquefy the metal, the free Si atoms will diffuse into the metal and generate a eutectic phase. Dissociation temperatures for $SiH_4$ and $Si_2H_6$, and $SiCl_4$ and $SiH_2Cl_2$ gases are between about 300° C. to about 500° C. (for $Si_2H_6$ and $SiH_4$), above about 800° C. ($SiCl_4$) and above about 600° C. ($SiH_2Cl_2$) respectively.

In instances when $SiCl_4$ or $SiH_2Cl_2$ are used, Cl atoms are also generated. Decomposition of $SiCl_4$ or $SiH_2Cl_2$ into Si and Cl in the presence of a carrier gas (e.g., $H_2$, $H_2Ar$) forms HCl. This creates a competition between etching with HCl and growth from the Si vapor. Chlorine aids in removal of interfacial oxide on Si substrates leading to oriented NW growth.

However, because the decomposition of $SiCl_4$ or $SiH_2Cl_2$ into Si and Cl occurs at a relatively high temperature (e.g., above about 600° C.), metal diffusion into the growing nanowires is more likely to occur if the temperature is maintained above about 600° C. for an extended time period. Furthermore, at higher temperatures, the loss of metal catalyst is more likely to occur due to increased melting of the catalyst leaving less catalyst (or none) available to promote growth of the nanowires, thus limiting the length to which the nanowires can be grown. Accordingly, following the initiation of nanowire growth and orientation with $SiCl_4$ or $SiH_2Cl_2$, it is suitable to introduce another precursor gas mixture (including, e.g., $Si_2H_6$ or $SiH_4$) to contact the metal, which gas mixture includes a precursor gas which decomposes into Si atoms at lower temperatures than the first precursor gas (but at a high enough temperature to form a eutectic phase with the metal catalyst).

The present invention also encompasses the use of multiple precursor gas mixtures added in different combinations and at different temperatures. In all embodiments of the present invention, the precursor gas mixtures used during any of the nanowire growth processes may further comprise one or more doping gases.

Examples of suitable doping gases that may be used in the practice of the present invention include, but are not limited to, $B_2H_6$, $POCl_3$ and $PH_3$. Further disclosure of CVD processes and use of various precursor gas mixtures and temperatures can be found in U.S. Patent Application No. 60/588, 363, filed Jul. 16, 2004, which is incorporated herein by reference.

As growth atoms (e.g., Si atoms) begin to precipitate out of the nucleating particles (e.g., gold film), nanowires will begin to grow out of areas of the film that are not covered by growth-inhibiting layer 210, or covered by another barrier. The bottom surface of nucleating particles 208 in FIGS. 2a and 2b may rest on either base substrate 202, removable layer 204 or separation layer 206 (see FIG. 2b), and therefore wire growth is suppressed through the bottom of, e.g., the gold pads. As either a percentage of, or the entire top surface of, the gold pads is covered by a growth-inhibiting layer 210, varying amounts of Si are forced to precipitate out at the side wall surface (edges) of the gold pads, and nanowires 212 protrude out of the pads, e.g., across the trench structure, in a horizontal orientation with respect to base substrate 202. As the diameter the growing nanowires is on the order of a few nanometers to hundreds of nanometers (determined by the thickness of the film), the gold pads is infinitely deep in all dimensions, and thus nanowires can easily grow from the edge of such pads.

As discussed throughout, the density of nanowires growing from the sides of the pads can be controlled by varying the amount of the top surface of the pads that is covered by the growth inhibiting layer. Allowing a portion of the pads to remain uncovered will cause a portion of the total number of growing nanowires to grow vertically from the top of the film, thereby reducing the total number, and hence density, of nanowires growing horizontally.

Horizontal growth of nanowires aids in the production of long, single, separate, oriented, nanowires, thus reducing or eliminating the problems of tangled and overlapping nanowires. Producing wires that do not overlap allows coating of individual wires and further processing (described below) without the concerns of shorts or entanglements between the wires. The length of the wires can be controlled by selectively spacing nucleating particles a predetermined distance from each other and by controlling growth times and conditions.

As discussed above, base substrate 202 on which nucleating particles 208 are formed can be crystalline (including semi-crystalline), amorphous, or contain combinations of both amorphous and crystalline areas. Growth from nucleating particles formed on crystalline substrates will generate preferentially oriented nanowires from both the side surface (walls) of the nucleating particles, as well as the portion of the top surface of the nucleating particles that is not covered with a nanowire growth-inhibiting layer 210. In such embodiments, both vertical and horizontal nanowires can be grown and then harvested or processed directly on the same substrate.

In other embodiments where an amorphous base substrate is used, nanowires growing from the side walls of the nucleating particles will be preferentially oriented, and thus the present invention does not require the use of crystalline substrates to generate preferentially oriented nanowires.

For example, as shown in FIGS. 2a, 2b and 3, the nucleating particles can be patterned in a way such that nanowires 212 grow from the side surface of both of the films toward one another, e.g., across the trench structure. In other embodiments (not shown), nucleating particles can be patterned in such a way so that nanowires do not grow toward each other, but rather, grow in substantially the same direction, such that longer length nanowires can be generated. Nanowires produced by the processes of the present invention can be any length, and suitably will attain a final length of about 100 nm to several microns, and in certain embodiments can attain lengths on the order of mms to cms. In suitable such embodiments, the nanowires produced according the present invention can attain a final length of a few 100 nms.

In another embodiment, the processes of the present invention, as shown in FIG. 1a, can further comprise a step 110 of forming a removable layer 204 on base substrate 202 (see FIG. 2b). Suitably, formation step 110 is performed prior to step 102 where nucleating particles 208 are formed. Removable layer 204 is formed on base substrate 202 such that the bottom surface of removable layer 204 interfaces with the top surface of base substrate 202. In such an embodiment, as illustrated in FIG. 2b, removable layer 204 separates nucleating particles 208 from base substrate 202. Removable layer 204 allows the nanowires to be later removed from the base substrate by various methods, including chemical or physical separation, for example. In suitable embodiments, removable layer 204 can be any selectively etchable layer (wet etch or dry etch) such as oxides that do not dissolve in HF. For example, $Al_2O_3$, nitrides, or high temperature refractory metals, such as Tungsten (W) (especially when nanowire growth utilizes precursor gases such as $SiCl_4$ and $SiH_2Cl_2$), or standard metals, such as Cr, and Ti, when used with precursor gases such as $SiH_4$, can be employed. In other embodiments, a second removable layer (not shown), such as oxide or nitride, can be added under the first removable layer. In such embodiments, the first removable layer can remain with the nanowires initially by removing it from the second layer (and hence the base substrate), and then subsequently removing the first removable layer from the nanowires at a later time if desired.

The processes of the present invention, as shown in FIG. 1a, can also further comprise a step 112 of forming a separation layer 206 on removable layer 204 prior to forming nucleating particles 208, as shown in FIG. 2b. In such embodiments, separation layer 206 is formed on removable layer 204 so that the bottom surface of separation layer 206 interfaces with the top surface of removable layer 204. In other embodiments (not shown), separation layer 206 can be formed directly on base substrate 202 without the presence of removable layer 204, such that the bottom surface of separation layer 206 interfaces with the top surface of base substrate 202. In certain embodiments, separation layer 206 forms the surface of the trenches between nucleating particles and provides an area on which nanowire growth suitably will not occur, thereby confining nanowire growth to a horizontal orientation between the nucleating particles. This separation layer can be any suitable material, including oxides such as aluminum oxide. The addition of such a separation layer allows for atomic layer deposition (ALD), or metal organic chemical vapor deposition, utilizing metal organics to deposit metallic layers on the surfaces of the nanowires. This separation layer also provides enhanced access to the nanowires for the purpose of adding core shell metals (e.g., tungsten or other suitable metals) and allows coating of the nanowires by elevating the nanowires above the base substrate.

Nanowires produced according to the processes of the present invention can be aligned using any method known in the art. For example, aligned thin films of nanowires can be produced by using the following techniques: Langmuir-Blodgett film alignment; fluidic flow approaches, such as described in U.S. Ser. No. 10/239,000, filed Sep. 10, 2002, incorporated herein by reference in its entirety; and application of mechanical shear force.

Once substantially horizontal nanowires are achieved, they then can be further processed in preparation for use in devices, for example electronic, mechanical and biomedical devices. One advantage of the present invention is that nanowires do not need to be removed from base substrate 202 in order to be processed, as the wires are already substantially oriented and are not entangled or risk shorting out by crossing one another.

Any on-substrate processing known or required by those skilled in the art can be performed after growth of the nanowires. In certain embodiments, a dielectric layer can be grown or deposited directly on the wires. As the wires are separate, each wire can be fully coated without the concern of sections of overlapping wires being coated. In further embodiments, an application of photo resist can be applied to the wafer and subsequently patterned such that the center few microns (defined by the channel length of the transistor device for example) is left behind to "anchor" the wires in position. In suitable embodiments, an oxide etch can then be used to remove the exposed ends of the nanowires and the oxide used to cap off all the edges of the gold film from which wire growth initiated. A subsequent gold etch can then be used to remove all excess gold from the wafer.

Figure 4:
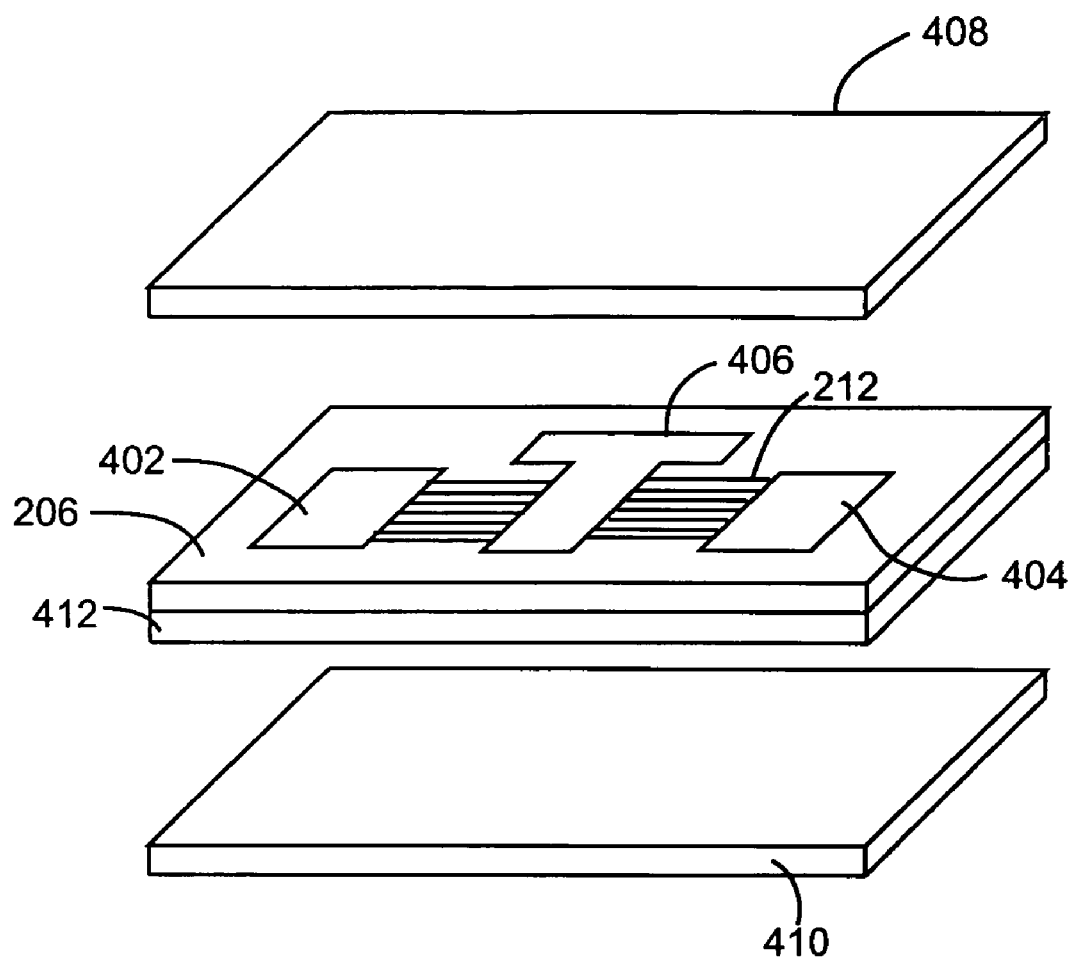
FIG. 4 is an example of a semiconductor device produced in accordance with one embodiment of the present invention.

In other embodiments, an implant, such as a gate electrode, can be added to the nanowires. In further embodiments, as shown in FIG. 4, nanowires 212 can be coupled between a source electrode 402 and a drain electrode 404 over a portion of the gate electrode 406. In other embodiments, source and drain electrodes can be added and ohmic contacts can be generated on the wires. As the wires are further "anchored" by the metal contacts, the "gate" photo resist can be removed and gate isolation and metal processing steps as known in the art can be used to finalize the nanowire preparation. Such processing allows for wafers that can comprise multiple semiconductor devices on the same base substrate.

Semiconductor devices prepared according to the present invention can have any number of contact areas formed to provide electrical connectivity. For example, anode and cathode electrodes can be formed with diodes or other two terminal devices. Other semiconductor devices can have greater or fewer numbers of contact areas formed. Suitable methods of preparing semiconductor devices using the processes and nanowires of the present invention are disclosed in U.S. patent application Ser. No. 10/674,060, filed Sep. 30, 2003, which is incorporated by reference herein.

A variety of contact area types can be generated or formed according to the present invention. The contact areas can be Ohmic and non-Ohmic. For example, a non-Ohmic Schottky diode barrier contact can be used as an electrode. A Schottky diode barrier contact is commonly used for a III-V semiconductor material when it is difficult to make a high quality gate dielectrics. Source electrodes, gate electrodes, and drain electrodes are formed of a conductive material, such as a metal, alloy, silicide, polysilicon, or the like, including combinations thereof, as would be apparent to a person having ordinary skill in the art. Note that the order in which the gates, sources, and drains are patterned can be varied. For example, gates, sources, and drains can be patterned simultaneously with each other or at different times.

Making reliable ohmic contacts with nanowires is difficult due to small contact areas and complicated interface states. Interfacial chemistry and physics between metal contacts and silicon are important technical areas regarding ohmic contacts. A key to success is the precise control of the metallization process and surface cleaning process prior to metallization. Suitable metallization schemes include Ti—Au, Ni and Al by e-beam evaporation. Various further processes, including ion gun cleaning, or HF etching can be employed to remove the surface dielectrics prior to metallization of source-drain electrodes.

In other embodiments, a dielectric layer can be formed on the nanowires. The dielectric layer can be formed by oxidizing the nanowires, or otherwise forming the dielectric layer. For example, non-oxided high dielectric constant materials can be used, including silicon nitride, $Ta_2O_5$, $TiO_2$, $ZrO_2$, $HfO_2$, $Al_2O_3$, and similar materials. Nitridation of nanowires can be accomplished with processes similar to those employed in oxidation of nanowires. These materials can be applied to nanowires by chemical vapor deposition (CVD), solution phase over-coating, or simply by spin-coating the appropriate precursor onto the substrate. Other known techniques can be employed.

The quality of a gate dielectric coating is important to nanowire performance in those devices employing a gate electrode. The technology for formation of a high quality gate dielectric is present in planar semiconductor technology. However, forming a pin-hole free gate dielectric with uniform thickness around the surface of nanowires without a defined crystallographic direction is technically challenging. This issue can be addressed from different perspectives. A process can be used to generate a uniform silicon oxide coating less than about 20 nm by slow thermal oxidation of silicon nanowires immediately following their growth. A key to controlling the quality of the oxide coating is nanowires having a smooth and consistent surface structure. A low oxidation process aids in avoiding hot spots and generating pin-hole free thin coatings. Alternatively, plasma assisted direct nitridation of silicon oxide coated nanowires can be used for generation of oxynitride or nitride coating on the nanowire surface.

The use of a removable layer as discussed throughout allows for removal and transfer of the nanowires either before or following processing methods like those described herein. For example, a tungsten layer can be deposited beneath the gold film (e.g., 208), or beneath the separation layer (e.g., oxide, 206). In other embodiments, the tungsten layer can act as a common electrical contact (and a first removable layer, e.g., 204) and a second removable layer (not shown) can be an oxide or nitride layer deposited between the tungsten layer and the base substrate.

In additional embodiments, shown in FIG. 4, where devices comprising, for example, nanowires 212, gate electrode 406, source electrode 402 and drain electrode 404, have been processed on top of a layer of tungsten 412, a flexible film 408 such as SU-8 (e.g., from MicroChem. Inc., Newton, Mass.) or other such polymeric film can then be deposited on top of the nanowires and electrodes (and patterned appropriately for contacts) to hold the devices together. An oxide or a nitride layer under the tungsten film can be etched away to release the tungsten film. Once turned upside down, the SU-8 film acts as a flexible substrate. Tungsten film 412 can at this point be removed. Alternatively, tungsten film 412 can remain for added stability and support. A further application of an additional flexible film 410 on to the nanowires, such as SU-8, would completely encapsulate the devices hence making a flexible film with buried nanowires and devices.

Figure 5:
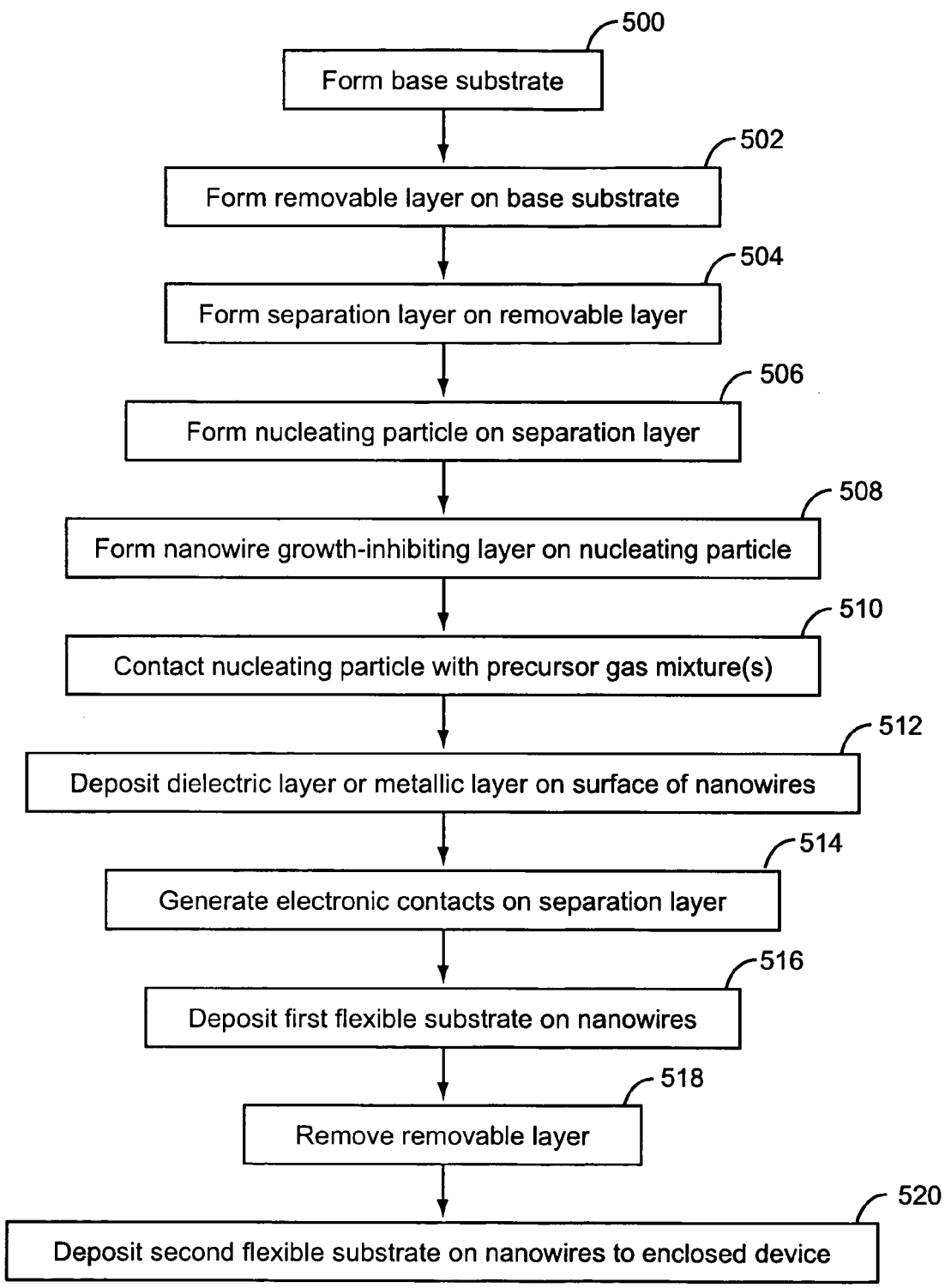
FIG. 5 is a flow chart depicting a process for preparing nanowire devices, in accordance with one embodiment of the present invention.

The present invention also provides processes for producing nanowire devices. FIG. 5 illustrates a method comprising the following steps. First, a base substrate is formed (500). A removable layer is then formed on the base substrate (502), such that the bottom surface of the removable layer interfaces with the top layer of the base substrate. A separation layer is then formed on the removable layer (504), such that the bottom surface of the separation layer interfaces with the top surface of the removable layer. A nucleating particle is then formed on the separation layer (506), such that the nucleating particle interfaces with the top surface of the separation layer. A nanowire growth-inhibiting layer is then formed (508) on the top surface of the nucleating particle.

The nucleating particle is then contacted with one or more precursor gas mixtures (510), whereby nanowires are grown from a side surface of the nucleating particle. A dielectric layer or metallic layer is then deposited (512) on the surface of the nanowires. Electronic contacts are then generated (514) on the separation layer.

The device processes of the present invention can also further comprise depositing (516) a first flexible substrate on the nanowires. The removable layer can then be removed (518). In other embodiments, the processes can further comprise depositing (520) a second flexible substrate on the nanowires to enclose the device.

In other embodiments of the present invention, steps 502, 504, 512, 514, 516, 518 and 520 can be optional, either not practiced individually, or several steps can be optionally not practiced. FIG. 4 illustrates a semi-conductor device that can be produced using such processes of the present invention where device contacts and flexible substrates have been added to horizontal nanowires of the present invention.

Figure 6:
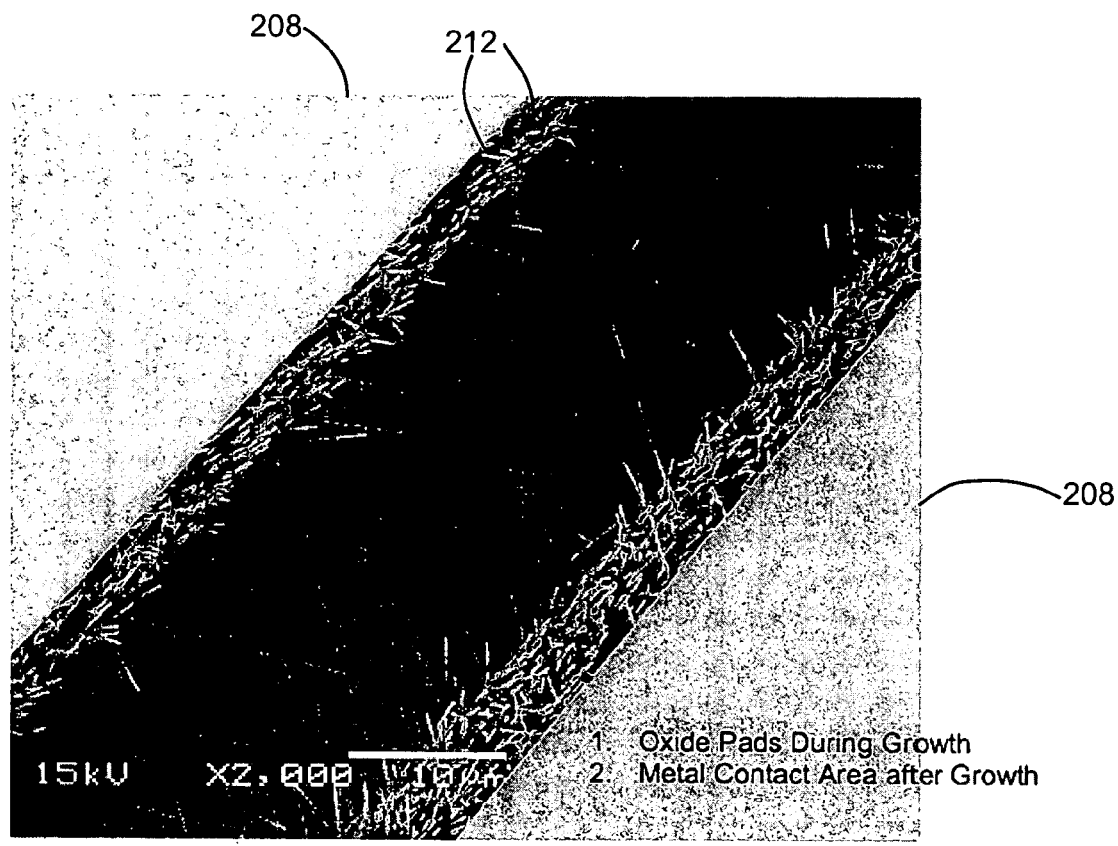
FIG. 6 is a scanning electron micrograph of horizontal nanowires produced according to the processes of the present invention.

FIG. 6 illustrates horizontal nanowires produced according to the processes of the present invention. Nanowires 212 can be seen growing from the side surfaces of nucleating particles 208 across the trench surface.

In other embodiments, the nanowires of the present invention can be encapsulated in polymers thereby producing a composite comprising a polymer and nanowires. This composite can then be harvested from the substrate layer. Suitable polymers for use in the present invention include, but are not limited to, elastomers, thermoplastics and thermosetting resins. Useful polymers include oligomers, which includes, but is not limited to, monomers, dimers, trimers, tetramers, pentamers, hexamers, heptamers, octamers, nonamers, decamers, undecamers, and dodecamers; branched, hyperbranched, dendritic and other non-linear structural forms of polymers;

prepolymers such as phenoxy and epoxy prepolymers; networked polymers such as interpenetrating and semi-interpenetrating network polymers; homopolymers, copolymers, terpolymers and other copolymers including random, statistical, alternating, block and graft copolymers and blends of two or more different polymers.

Particular examples of polymers for use in composites include, but are not limited to, polyalkanes, polyhaloalkanes, polyalkenes, polyalkynes, polyketones, polycarbonates, polyamides, polyimides, polyarylenes, polyarylvinylenes, polyheteroarylenes, polyheteroarylvinylenes polyesters, polyethers, polyurethanes, polybenzimidazoles, polysulfides, polysiloxanes, polysulfones, polysaccharides, polypeptides, polyphosphazenes, polyphosphates, phenolic and phenol-formaldehyde resins, epoxy and phenoxy resins, and urea- and melamine-formaldehyde resins. Such composites and methods for their preparation are disclosed in U.S. patent application Ser. No. 10/910,800, filed Aug. 4, 2004, which is incorporated herein by reference.

The present invention also provides nanowires produced by any of the processes of the present invention. As discussed throughout, nanowires produced by the processes of the present invention will suitably be of a length of at least about 100 nm and at least about 1 nm to less than about 1 μm in diameter, and may comprise various dopants (i.e., p- and n-type regions) throughout their length.

The present invention also provides electronic circuits comprising the nanowires produced by any of the processes of the present invention. Suitably, collections of nanowires produced according to the processes of the present invention are useful building blocks for high performance electronics. A collection of nanowires orientated in substantially the same direction will have a high mobility value. For example a thin film of nanowires used in a semiconductor device can be formed to include 2, 5, 10, 100, and any other number of nanowires between or greater than these amounts, for use in high performance electronics. Examples of such circuits and electronics can be found in U.S. patent application Ser. No. 10/674,060, filed Sep. 30, 2003, which is incorporated herein by reference.

The nanowires of the present invention can also be used to make high performance composite materials when combined with polymers/materials such as organic semiconductor materials, which can be flexibly spin-cast on any type of substrate. Nanowire/polymer composites can provide properties superior to pure polymeric materials. Additional composites and methods for their preparation are disclosed in U.S. patent application Ser. No. 10/910,800, filed Aug. 4, 2004, which is incorporated herein by reference.

P-doped nanowires and n-doped nanowires produced by the processes of the present invention can be separately fabricated, and deposited in a homogeneous mixture onto a surface, such as a macroelectronic substrate. On a macroscopic level, the resulting material appears to contain a high concentration of both n- and p-dopants. By creating such a mixture of p- and n-doped nanowires, macroelectronic devices can be fabricated that respond as if they are both n- and p-doped. For example, a resulting thin film of nanowires that includes both n-doped and p-doped nanowires can exhibit characteristics of both n-doped and p-doped nanowires. For example, diode, transistor, and other known electrical devices can be fabricated to include a combination of p-doped nanowires and n-doped nanowires.

Nanowires produced by the processes of the present invention can also be used to produce electrical devices such as p-n diodes, transistors, and other electrical device types, using nanowire heterostructures as described herein. Nanowire heterostructures include a plurality of p-n junctions along the length of the nanowire and can include alternating portions or segments along their lengths that are differently doped.

Numerous electronic devices and systems can incorporate semiconductor or other type devices with thin films of nanowires produced by the processes of the present invention. Some example applications for the present invention are described below or elsewhere herein for illustrative purposes, and are not limiting. The applications described herein can include aligned or non-aligned thin films of nanowires, and can include composite or non-composite thin films of nanowires.

Semiconductor devices (or other type devices) can be coupled to signals of other electronic circuits, and/or can be integrated with other electronic circuits. Semiconductor devices can be formed on large substrates, which can be subsequently separated or diced into smaller substrates. Furthermore, on large substrates (i.e., substrates substantially larger than conventional semiconductor wafers), semiconductor devices formed thereon can be interconnected.

The nanowires produced by the processes of the present invention can also be incorporated in applications requiring a single semiconductor device, and to multiple semiconductor devices. For example, the nanowires produced by the processes of the present invention are particularly applicable to large area, macroelectronic substrates on which a plurality of semiconductor devices are formed. Such electronic devices can include display driving circuits for active matrix liquid crystal displays (LCDs), organic LED displays, field emission displays. Other active displays can be formed from a nanowire-polymer, quantum dots-polymer composite (the composite can function both as the emitter and active driving matrix). The nanowires produced by the processes of the present invention are also applicable to smart libraries, credit cards, large area array sensors, and radio-frequency identification (RFID) tags, including smart cards, smart inventory tags, and the like.

The nanowires produced by the processes of the present invention are also applicable to digital and analog circuit applications. In particular, the nanowires produced by the processes of the present invention are useful in applications that require ultra large-scale integration on a large area substrate. For example, a thin film of nanowires produced by the processes of the present invention can be implemented in logic circuits, memory circuits, processors, amplifiers, and other digital and analog circuits.

The nanowires produced by the processes of the present invention can be applied to photovoltaic applications. In such applications, a clear conducting substrate is used to enhance the photovoltaic properties of the particular photovoltaic device. For example, such a clear conducting substrate can be used as a flexible, large-area replacement for indium tin oxide (ITO) or the like. A substrate can be coated with a thin film of nanowires that is formed to have a large bandgap, i.e., greater than visible light so that it would be non-absorbing, but would be formed to have either the HOMO or LUMO bands aligned with the active material of a photovoltaic device that would be formed on top of it. Clear conductors can be located on two sides of the absorbing photovoltaic material to carry away current from the photovoltaic device. Two different nanowire materials can be chosen, one having the HOMO aligned with that of the photovoltaic material HOMO band, and the other having the LUMO aligned with the LUMO band of the photovoltaic material. The bandgaps of the two nanowire materials can be chosen to be much larger than that of the photovoltaic material. The nanowires, according to this embodiment, can be lightly doped to decrease the resistance of the thin films of nanowires, while permitting the substrate to remain mostly non-absorbing.

Hence, a wide range of military and consumer goods can incorporate the nanowires produced by the processes of the present invention. For example, such goods can include personal computers, workstations, servers, networking devices, handheld electronic devices such as PDAs and palm pilots, telephones (e.g., cellular and standard), radios, televisions, electronic games and game systems, home security systems, automobiles, aircraft, boats, other household and commercial appliances, and the like.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

All publications, patents and patent applications mentioned in this specification are indicative of the level of skill of those skilled in the art to which this invention pertains, and are herein incorporated by reference to the same extent as if each individual publication, patent or patent application was specifically and individually indicated to be incorporated by reference.

What is claimed is:

1. A process for producing silicon nanowires, comprising:
    (a) providing a base substrate;
    (b) forming one or more nucleating particle comprising gold (Au) on the base substrate;
    (c) forming a nanowire growth-inhibiting layer on the one or more nucleating particle; and
    (d) contacting the nucleating particle with one or more precursor gas mixtures suitable for the growth of silicon nanowires,
    whereby silicon nanowires are grown from a side surface of the nucleating particle.

2. The process of claim 1, further comprising forming a removable layer on the base substrate prior to forming the one or more nucleating particle.

3. The process of claim 2, further comprising forming a separation layer on the removable layer prior to forming the one or more nucleating particle.

4. The process of claim 1, further comprising forming a separation layer on the base substrate prior to forming the one or more nucleating particle.

5. The process of claim 3 or claim 4, further comprising forming the separation layer as an oxide layer.

6. The process of claim 2, wherein forming the nanowire growth-inhibiting layer on the one or more nucleating particle comprises using photolithography to pattern the growth-inhibiting layer.

7. The process of claim 6, further comprising (f) depositing a first flexible substrate on the nanowires.

8. The process of claim 7, further comprising (g) removing the removable layer.

9. The process of claim 8, further comprising (h) depositing a second flexible substrate on the nanowires opposite the first flexible substrate.

10. The process of claim 1, further comprising forming the one or more nucleating particle as a plurality of pads by etching a metallic film deposited on the base substrate.

11. The process of claim 1, further comprising forming the nanowire growth-inhibiting layer as a silicon oxide layer.

12. The process of claim 1, further comprising forming the base substrate of silicon.

13. The process of claim 1, wherein the precursor gas mixture comprises $SiH_4$, $Si_2H_6$, $SiCl_4$ or $SiH_2Cl_2$, and further comprises $B_2H_6$, $POCl_3$ or $PH_3$.

14. The process of claim 1, further comprising (e) depositing a dielectric layer or metallic layer on the surface of the nanowires.

15. The process of claim 14, further comprising (f) depositing a first flexible substrate material on the nanowires.

16. The process of claim 15 or claim 7, wherein the first flexible substrate comprises one or more metal contacts.

17. A process for producing a nanowire device, comprising:
    (a) providing a base substrate;
    (b) forming a removable layer on the base substrate;
    (c) forming a separation layer on the removable layer;
    (d) forming one or more nucleating particle on the separation layer;
    (e) forming a nanowire growth-inhibiting layer on the one or more nucleating particle;
    (f) contacting the one or more nucleating particle with one or more precursor gas mixtures, whereby nanowires are grown from a side surface of the one or more nucleating particle;
    (g) depositing a dielectric layer or metallic layer on the nanowires;
    (h) generating electronic contacts on the separation layer; and
    (i) removing the removable layer.

18. The process of claim 17, wherein the one or more nucleating particle comprises a plurality of pads which have been formed from a metallic film that has been deposited on the base substrate.

19. The process of claim 18, wherein the metallic film comprises Au, Pt, Fe, Ti, Ga, Ni or Sn.

20. The process of claim 17, wherein the separation layer is an oxide layer.

21. The process of claim 17, wherein the nanowire growth-inhibiting layer is silicon oxide.

22. The process of claim 17, wherein the base substrate comprises silicon.

23. The process of claim 17, wherein the precursor gas mixture comprises $SiH_4$, $Si_2H_6$, $SiCl_4$ or $SiH_2Cl_2$, and further comprises $B_2H_6$, $POCl_3$ or $PH_3$.

* * * * *